(12) United States Patent
Eskildsen

(10) Patent No.: US 6,356,456 B2
(45) Date of Patent: *Mar. 12, 2002

(54) LOW PIN COUNT CARD RETAINER

(75) Inventor: Steven R. Eskildsen, Folsom, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,109

(22) Filed: Jun. 23, 1998

(51) Int. Cl.$^7$ .............................. H05K 7/12; H05K 7/14
(52) U.S. Cl. ........................ 361/801; 361/737; 361/759
(58) Field of Search .................................. 361/736, 737, 361/740, 759, 801, 802; 439/945, 946; 206/707, 706, 701, 308.1; 248/560; 220/4.05; 24/548, 553, 559, 563

(56) References Cited

U.S. PATENT DOCUMENTS

| | | | |
|---|---|---|---|
| 4,887,188 A | * 12/1989 | Yoshida et al. | 361/684 |
| 5,155,663 A |   10/1992 | Harase | |
| 5,305,180 A | *  4/1994 | Mitchell et al. | 361/685 |
| 5,395,112 A | *  3/1995 | Darling | 273/148 B |
| 5,483,422 A | *  1/1996 | Bowen et al. | 361/802 |
| 5,505,299 A | *  4/1996 | Ditzig et al. | 206/308.1 |
| 5,531,324 A | *  7/1996 | Kosaki et al. | 206/449 |
| 5,752,857 A | *  5/1998 | Knights | 439/638 |
| 5,889,649 A |    3/1999 | Nabetani et al. | |
| 6,050,848 A | *  4/2000 | Yao | 439/483 |

OTHER PUBLICATIONS

Examples of Extractor Prior Art, 12 pgs., prior to May 30, 1998.
Product Description—Berg Electronics, 1997 PC Card Resource Directory, prior to Jun. 17, 1998.
Product Description—AMP, Inc., 1997 PC Card Resource Directory, AMP PC Card Components, prior to Jun. 17, 1998.
Product Description—JST Corporation, 1997 PC Card Resource Directory, Memory Card Connectors and Ejectors, prior to Jun. 17, 1998.
Product Description—Fujitsu Takamisawa America, Inc., 1997 PC Card Resource Directory, PC Card Connectors, prior to Jun. 17, 1998.
International Search Report mailed Jan. 24, 2000 in counterpart PCT application No. PCT/US99/11241.

* cited by examiner

Primary Examiner—Jayprakash N. Gandhi
(74) Attorney, Agent, or Firm—Blakely, Sokoloff, Taylor & Zafman LLP

(57) ABSTRACT

A method and apparatus for retaining an electronic function card in the receptacle of a host data processing system (host socket) is described. The present invention exerts a retention force on the card in addition to the frictional forces exerted on each of the connector contacts inserted into the host socket. By increasing the retention forces exerted on an electronic function inserted into a host socket, the chance of the card dislodging from the host socket during a mechanical shock event is reduced. The present invention also provides tactile and/or auditory feedback to the user to indicate when the card is fully inserted into the host socket. Further, a card extractor may be coupled to the retainer of the present invention. When disengaged, the card extractor will release the retention force on the card and the card may be easily removed from the host socket.

11 Claims, 11 Drawing Sheets

LOW PIN COUNT CARD RETAINER

BACKGROUND OF THE INVENTION

1. Field of the Invention

The present invention relates generally to the field of electronic function cards for use in data processing systems. More particularly, the present invention relates to an apparatus and method for retaining an electronic function card in a receptacle of a data processing system.

2. Description of the Related Art

Data processing systems have been configured for use with electronic function cards that provide increased functionality for the data processing system. Electronic function cards typically contain a printed circuit board having electronics and circuitry to implement their functionality. Such cards may be used to provide increased memory or storage capacity for the data processing system. Electronic function cards may also be used to provide for communications capabilities for the data processing system with external hosts, data processing systems, or networks. The cards provide convenience for users of a data processing system by allowing the user to install additional capabilities or features as needed.

Electronic function cards are typically portable cards that may be inserted into and detached from a receptacle housed within the host data processing system (or a host socket). The Personal Computer Memory Card International Association (PCMCIA) has devised standards for electronic function cards to provide compatibility between various data processing systems and various electronic function cards. The PCMCIA standards specify a 68-pin connector at one end of a PCMCIA card for insertion into a compatible receptacle in the host data processing system (or host socket). When inserted into the host socket, the card is held in place by the frictional force exerted on each of the 68 pins of the card connector.

Many new cards, such as flash memory cards, small form factor cards, miniature cards, and smart cards, are being made with substantially fewer contact pins even though in many cases the size or mass of the card remains the same. In other words, the number of contact pins is being reduced faster than the size or weight of the card. With fewer contact pins engaged, there is a correspondingly smaller frictional force (or retention force) exerted on the electronic function card to retain the card in the host socket. With smaller retention forces, the card can become dislodged from the host socket more easily during mechanical shock events, such as when the data processing system is dropped or jostled.

To prevent a card from becoming dislodged as the pin count of the card is reduced, the weight of the card must be reduced by the same percent reduction as the pin count reduction. With a card of PCMCIA size having only 34 pins, the weight of the card per pin has doubled when compared to a PCMCIA card. The added weight per pin can cause a problem in retaining the card in the host socket. Often, however, it is not possible to reduce the weight of the card even when the card's pin count has been reduced. Similarly, additional electronics may be added to a standard PCMCIA card or attachments may be coupled to the card, both of which add weight to the card and increase the card weight per pin. Thus, a low cost feature that may be added to the card to increase the retention forces on the card and reduce the chance of the card dislodging from its host socket is desirable. With such a feature, low pin count cards (those having less than the standard 68 pins) and cards having attachments or added weight may have similar resistance to becoming dislodged as a PCMCIA card.

Further, current card and host socket interconnections do not employ direct feedback during insertion operations to indicate when the card is fully inserted into the host socket. Often, when a PCMCIA card is inserted into a host socket, the system "senses" that the card is inserted and, typically after a time delay, the system responds with an auditory feedback, such as a beep. However, the feedback can occur when the electrical contacts are just starting to make contact. In other words, the card does not have to be fully inserted for the system to signal that the insertion is complete. A premature signal can result in a risky connection, in that small movements, such as vibrations, may cause the card to be disconnected from one or more contacts.

Attempts to solve the premature feedback are flawed due to inadequate specifications for the card connector contact design. For example, the PCMCIA's sequential connection scheme using multiple length pins in the host socket has not been successful. Thus, it is desirable to have a tactile and/or auditory feedback signal to clearly indicate to the user when the card has been fully inserted into the host socket.

SUMMARY OF THE INVENTION

The present invention describes a method and apparatus for increasing the retention forces exerted on an electronic function card inserted into a receptacle of a data processing system (or host socket) to reduce the chance of the card dislodging from the host socket. The present invention may be comprised of an electronic function card having at least one spring-loaded button on the card casing. The host socket for the card has a corresponding indention on the host socket such that when the card is inserted into the host socket, the spring-loaded button will snap into place and reside within the corresponding indention. The spring loaded button and indention combination may be reversed such that the indention is a part of the card casing and the spring-loaded button is a part of the host socket. The button or indention may be placed at one or more locations on the card casing, with corresponding indention(s) or button(s) located on the host socket. A second embodiment of the present invention exerts a retention force on a card using a spring-loaded arm extending from the host socket. The spring-loaded arm has at least one stop that conforms with the contour of the card to securely hold the card in place. Both embodiments of the present invention exert a retention force on the card in addition to the frictional force exerted on the card connector pins to reduce the chance of the card dislodging from the host socket during a mechanical shock event.

DETAILED DESCRIPTION OF THE INVENTION

The following detailed description sets forth a method and apparatus for increasing the retention forces exerted on an electronic function card inserted into a receptacle of a data processing system (or host socket) to reduce the chance of the card dislodging from the host socket. In the following description, details are set forth such as specific dimensions, electronic function card applications, configurations, etc., in order to provide a more thorough understanding of the present invention. It will be appreciated by one skilled in the art, however, that the present invention may be practiced without these specific details. In other instances, well-known devices, structures, techniques, materials, etc., have not been described in particular detail so as to not obscure the present invention. Each of the different embodiments of the present invention is discussed as used with a data processing system. Note, however, that each embodiment may be used with other types of data processing devices.

Figure 1:
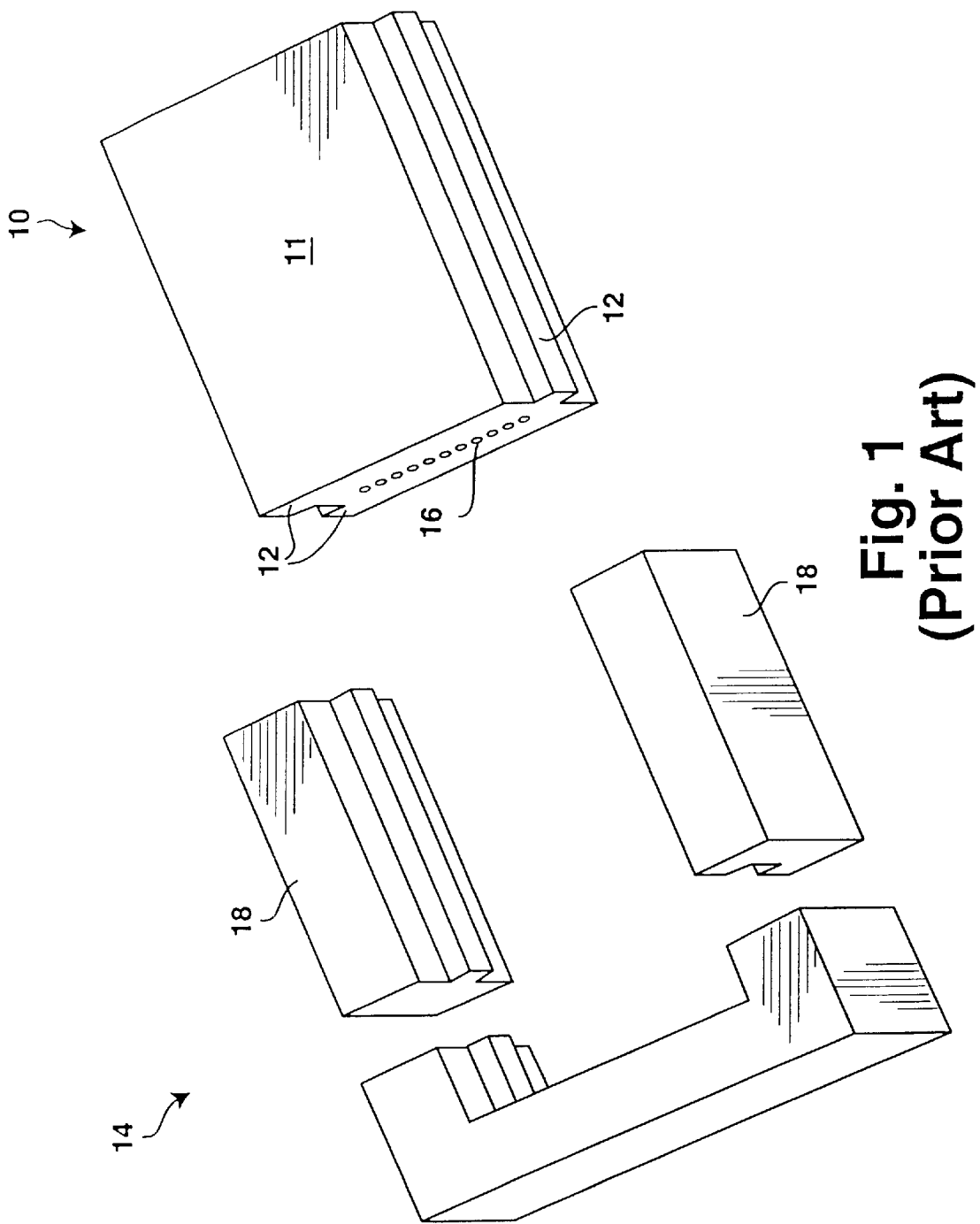
FIG. 1 is a pictorial illustration of a host socket and electronic function card of the prior art.

FIG. 1 illustrates a host socket 14 and an electronic function card 10 of the prior art. The electronic function card 10 is comprised of a casing 11 that houses an integrated circuit (IC). The connector contacts 16 are internally connected to the IC and extend through the casing 11 to form the electrical interface between the IC and the host socket and allow communication between the card components and the data processing system. To insert the card 10 into the host socket 14, slide the side arms 12 of the card 10 along the side rails 18 of the host socket 14. The frictional force exerted on the connector contacts 16 then holds the card 10 in place within the host socket 14. Note also that there is no indication for the user, other than attempting to judge the change in mechanical resistance during insertion, to indicate when the card 10 has reached the minimum insertion distance into the host socket 14.

The Personal Computer Memory Card International Association (PCMCIA) has set forth standards for electronic function cards specifying a 68-pin connector at one end of a PCMCIA card. The combined frictional force (or retention force) exerted on the 68 pins when the card is inserted in the host socket is sufficient to secure a PCMCIA card in the host socket. However, as new cards are developed, many are using fewer than 68 pins even though the size or mass of the card may remain the same. For example, some flash memory cards are being developed with only an 11-pin connector. The combined frictional force exerted on 11 pins is significantly less than the frictional force exerted on 68 pins. Thus, cards having a low pin count connector are more susceptible to becoming dislodged from the host socket by a mechanical shock event due to the inadequate retention force exerted on the pins. Similarly, additional electronics may be added to a PCMCIA card or attachments may be coupled to the card, both of which increase the card weight per pin and make the card more susceptible to becoming dislodged from the host socket.

The present invention describes an apparatus and method that increases the retention forces exerted on an electronic function card inserted into a host socket to reduce the chance of the card becoming dislodged from the host socket due to an insufficient frictional force exerted on the card's connector contacts. The present invention exerts a retention force on the electronic function card in addition to the frictional forces exerted on each of the pins inserted into the host socket. The additional retention force may be exerted in one of several manners.

Figure 2:
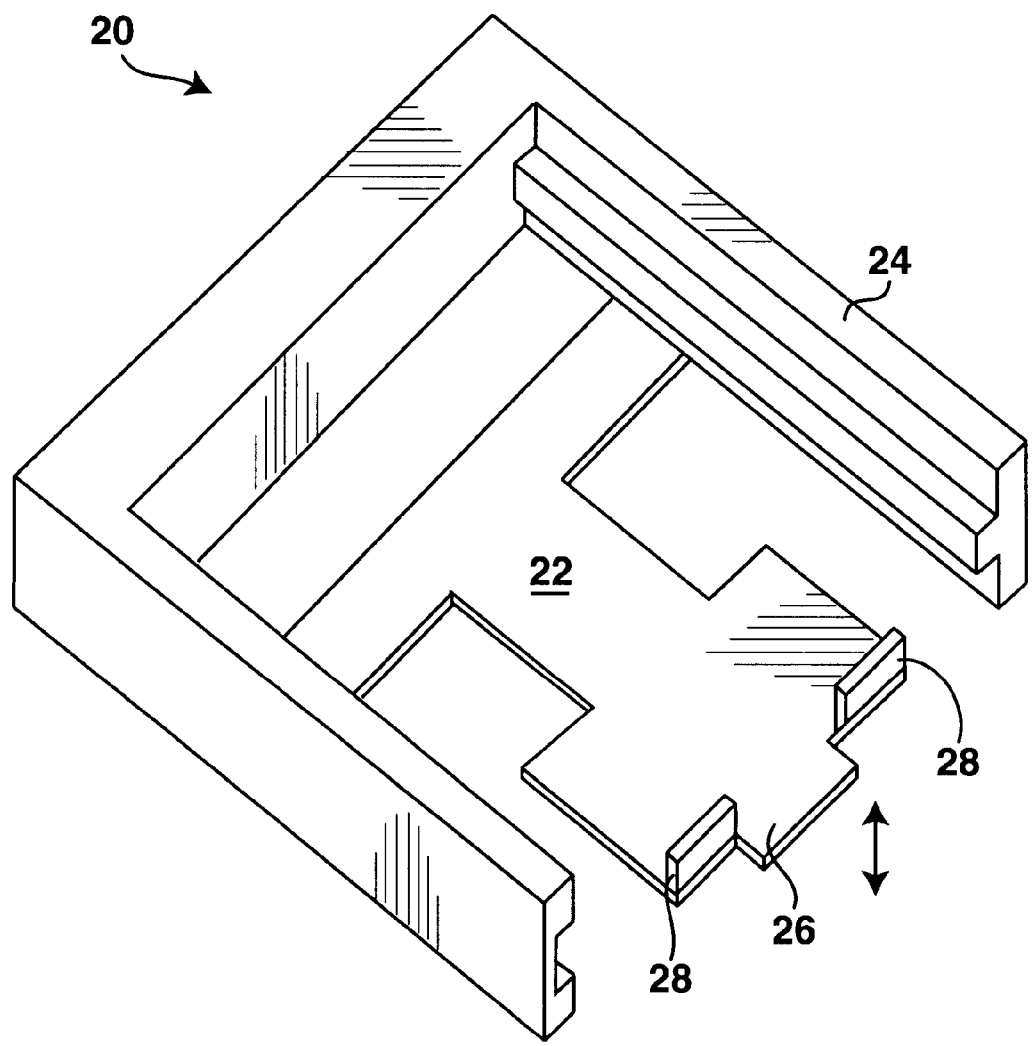
FIG. 2 is a pictorial illustration of a host socket of the present invention having stops to exert a retention force on an inserted electronic function card and securely retain the card within the host socket.

FIG. 2 is a pictorial illustration of a host socket of the present invention having stops to exert a retention force on an inserted electronic function card and securely retain the card within the host socket. In this embodiment of the present invention, a retention feature taking advantage of the natural shape (or contour) of the card is added to the host socket of the prior art. A spring-loaded arm 22 extends from the base of the side rails 24 of the host socket 20. The host socket 20 and spring-loaded arm 22 are preferably a single piece of plastic (organic resin) formed by injection molding. The end 26 of the arm 22 may move up and down. When the arm 22 is sufficiently depressed at end 26 to allow the card to clear the stops 28, a card (such as the one shown in FIG. 1A) may be linearly inserted into the host socket 20 along the side rails 24. Once the card is fully inserted into the host socket 20, the arm 22 will raise back into its initial position. When the arm 22 raises back into position, the stops 28 fit securely around the back edge of the card.

Note that when loading a card into the host socket 20, the spring-loaded arm as shown may be manually depressed at end 26. However, the stops 28 may be angled such that when the front edge of the card encounters the stops, the front edge of the card will slide up the angled stops and depress the arm 22 as the card is inserted into the host socket. Then, once the card is fully inserted into the host socket, the arm 22 will automatically raise back into its original position and hold the card securely in place.

The stops 28 on the host socket 20 serve two purposes. As a card is inserted into the host socket 20 and slid along the side rails 24, the arm 22 will remain depressed. Once a card is fully inserted into the host socket 20, however, the stops 28 will snap up around the lower back corners of the card.

This motion will serve as an indicator to the user that the card is fully inserted into the host socket 20. Further, the stops 28 are designed to fit around the back edge of the card. Thus, once the stops 28 snap up into position, the card will be held securely in place. The stops 28 provide a retention force on the card in addition to the frictional force exerted on the pins of the card to keep the card securely attached to the host socket 20 and prevent the card from becoming disconnected during a mechanical shock event.

To remove the card from the host socket 20, the arm 22 is simply depressed at the end 26 until the stops 28 are below the lower surface of the card. The card can then be easily removed by sliding the card out of the host socket 20 along the side rails 24. Once the card is completely removed from the host socket 20, the arm 22 will return to its original position.

Figure 3A:
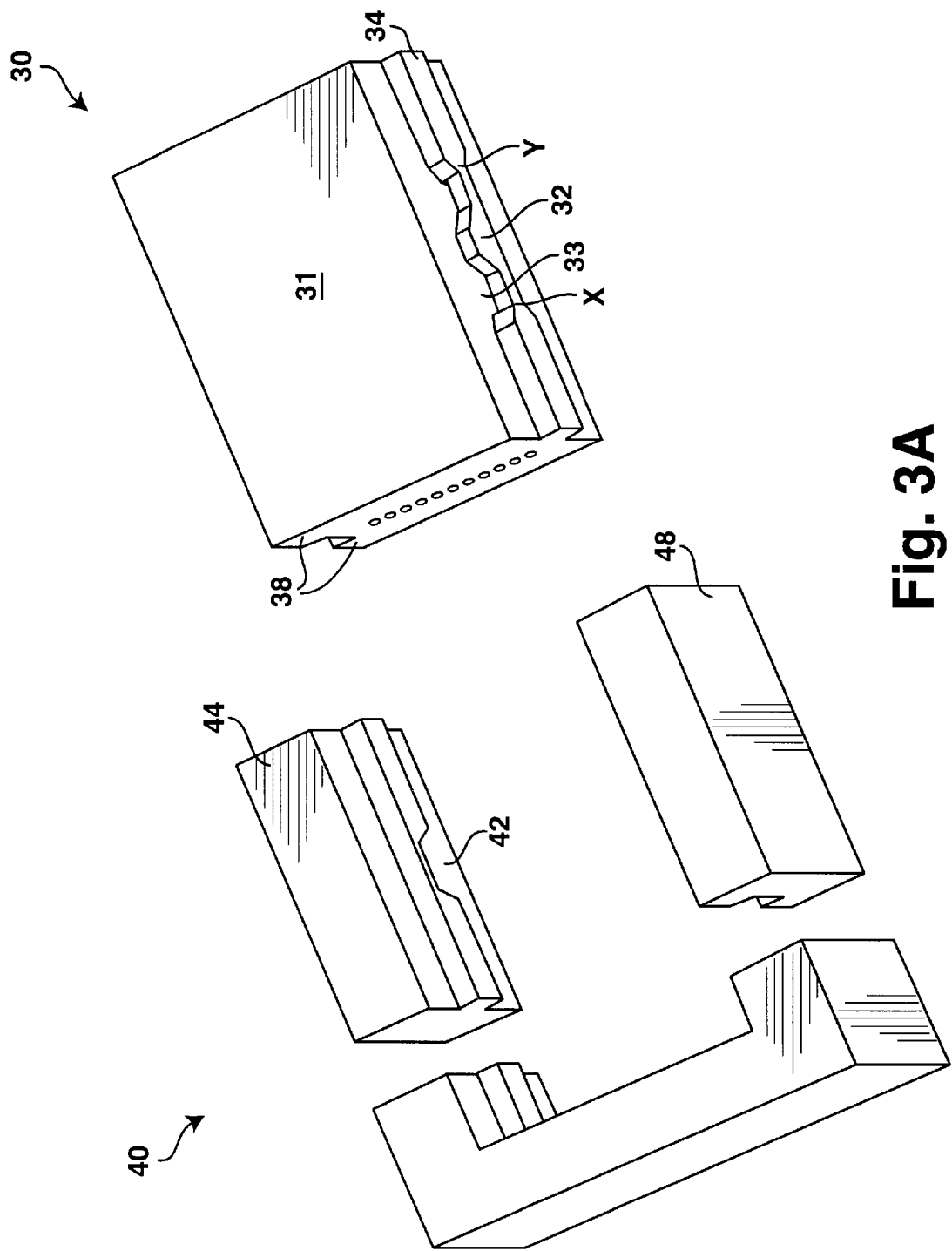
FIG. 3A is a pictorial illustration of a side view of the present invention showing an electronic function having spring loaded buttons on its sides and a host socket having corresponding indentions such that when the card is inserted into the host socket the buttons reside within the indentions and a retention force is exerted on the card to securely hold the card within the host socket.
Figure 3B:
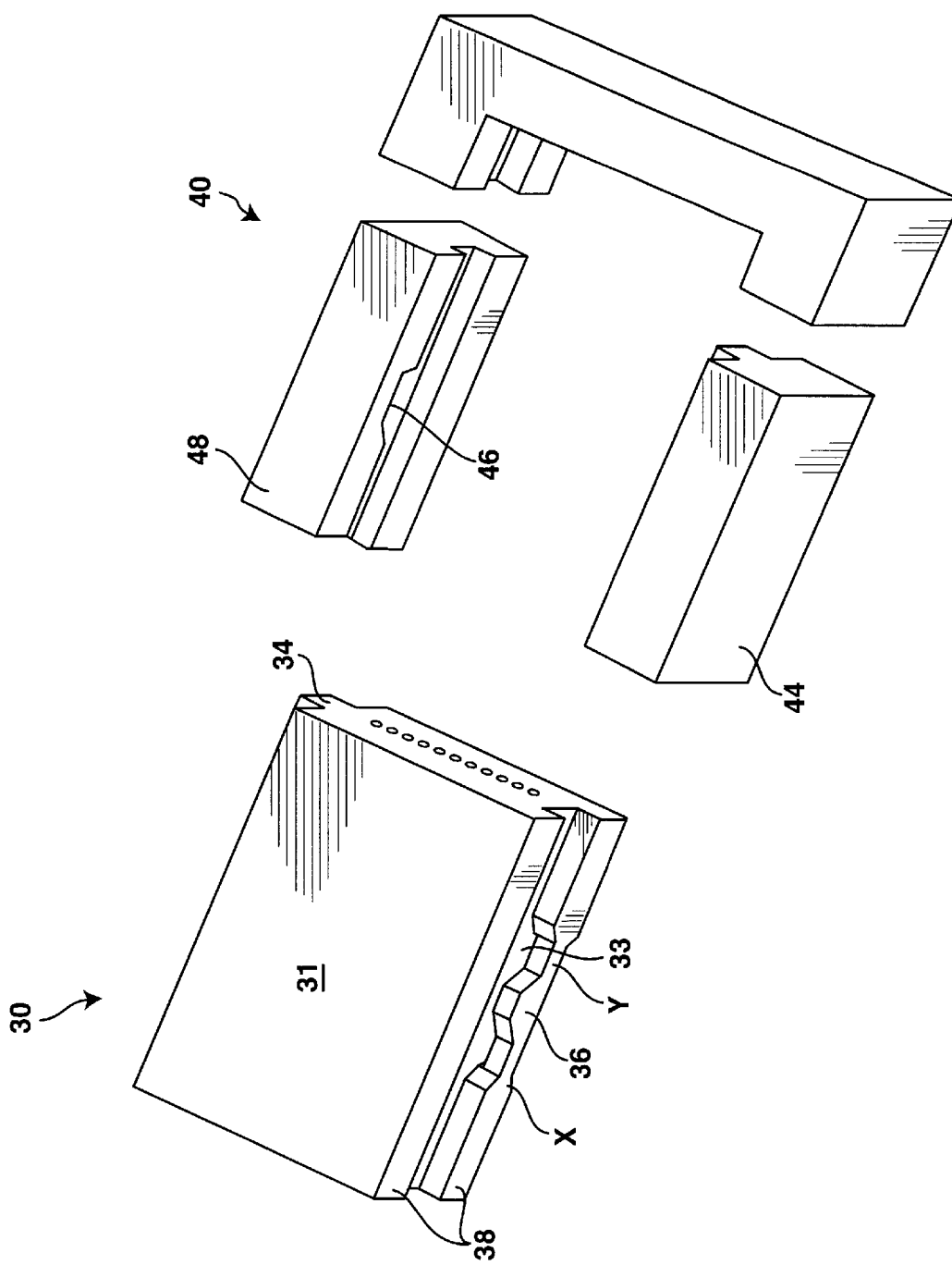
FIG. 3B is a pictorial illustration showing the opposite side view of the card and host socket shown in FIG. 3A.

FIGS. 3A and 3B are pictorial illustrations of opposite sides of a second embodiment of the present invention showing an electronic function count card having spring-loaded buttons on its sides and a host socket having corresponding indentions such that when the card is inserted into the host socket the buttons reside within the indentions and a retention force is exerted on the card to securely hold the card within the host socket. Note that in this embodiment of the present invention, both the host socket and the card are modified with respect to the prior art.

A card casing (or housing) 31 is shown having a first button (or stop, knob, etc.) 32 on side arm 34, and a second button 36 located on side arm 38. Note that the buttons 32 and 36 may be located on any part of the sides of the casing 31, including all surfaces of the side arms 34 and 38. On both sides of the casing 31, the side arms are not connected to the casing 31 between Points X and Y. In the preferred embodiment, a small gap exists between the buttons 32 and 36 and the side of the casing 31. Because the buttons 32 and 36 stand slightly off from the sides 33 of the casing 31, the button may move separate of the casing which allows for a spring-like action. Thus, each button 32 and 36 is spring-loaded, which allows them to each move up or down when pressed upon. Note that the casing 31, including the side arms 34, is preferably a single piece of plastic formed from injection molding.

A host socket 40 is shown that corresponds with the electronic function card 30. The side arms of the host socket are shown separated from the back of the host socket merely for illustrative purposes. A first indention (or cavity) 42 is located on the side rail 44, and a second indention 46 is located on side rail 48 of the host socket 40. Once the card 30 is linearly inserted into the host socket 40, the button 36 will reside in the indention 42 and the button 32 will reside in the indention 46.

To insert the card 30 into the host socket 40, the card 30 slides along the side rails 48 and 44 of the host socket 40. When the buttons 32 and 36 encounter the side rails 44 and 48, they are pressed down to allow the card 30 to continue sliding along the side rails 44 and 48. In the preferred embodiment, each button 36 and 32 has angled sides such that when the front edge of the buttons 36 and 32 encounters the side rails 44 and 48, the buttons 36 and 32 will be depressed as the card 30 continues to be inserted into the host socket 40.

Once the card 30 is fully inserted into the host socket 40, the buttons 36 and 32 will return to their original position and reside within the indentions 42 and 46. The position of the buttons 36 and 32 and indentions 42 and 46 are designed to correspond when the card 30 is fully inserted into the host socket 40. The location of the indention and buttons are positioned on the side arms and side rails so that the points of contact between the buttons and indentions are at the midpoint of tolerances with respect to the full insertion of the card 30 into the host socket 40.

As with the stops discussed above in the first embodiment, the corresponding buttons 32 and 36 and indentions 46 and 42 serve two functions - provide feedback indicating that the card is fully inserted into the host socket and add a retention force to hold the card within the host socket. First, when the buttons 32 and 36 reach the indentions 46 and 42, a click will be audible as the buttons 32 and 36 raise back up to their original position and reside within the indentions 46 and 42. The click provides an auditory feedback indicating that the card is fully and securely inserted into the host socket. Further, the user will be able to sense the change in the insertion force (the force applied to insert a card into a host socket) once the buttons 32 and 36 are residing in indentions 46 and 42. The resistance of the buttons 32 and 36 pressing against the indentions 46 and 42 provides a tactile feedback to the user indicating that the card is fully and securely inserted into the host socket.

Second, when the buttons 32 and 36 reside within the indentions 42 and 46 respectively, a retention force is exerted on the card 30 at the point of the buttons 32 and 36. This retention force is in addition to the friction force on the connector contacts and reduces the chance that the card 30 will become disconnected from the host socket 40 during a mechanical shock event.

Figure 4A:
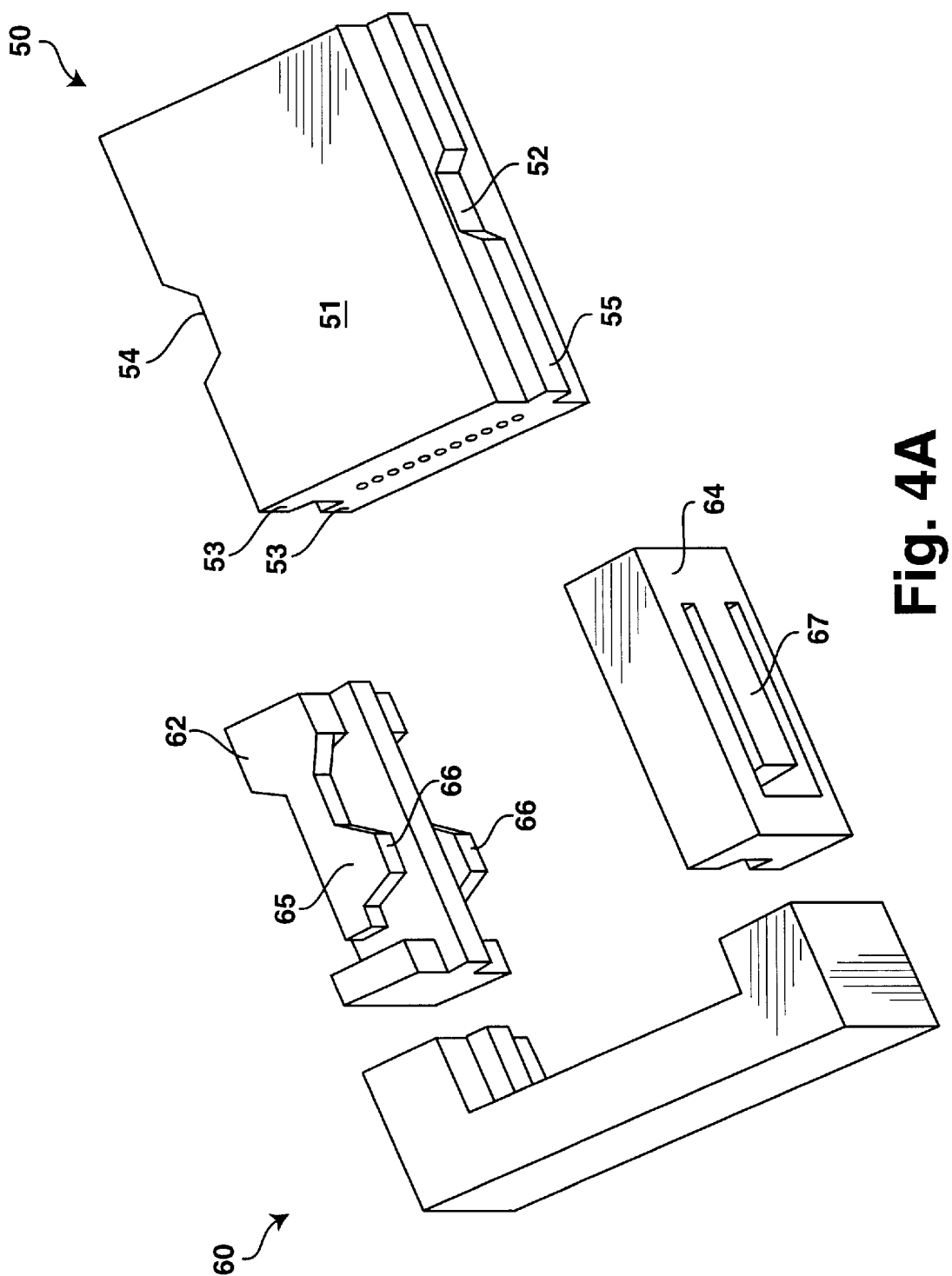
FIG. 4A is a pictorial illustration of a side view of the present invention showing an electronic function card having indentions on its sides and a host socket having corresponding spring loaded buttons such that when the card is inserted into the host socket the buttons reside within the indentions and a retention force is exerted on the card to securely hold the card within the host socket.
Figure 4B:
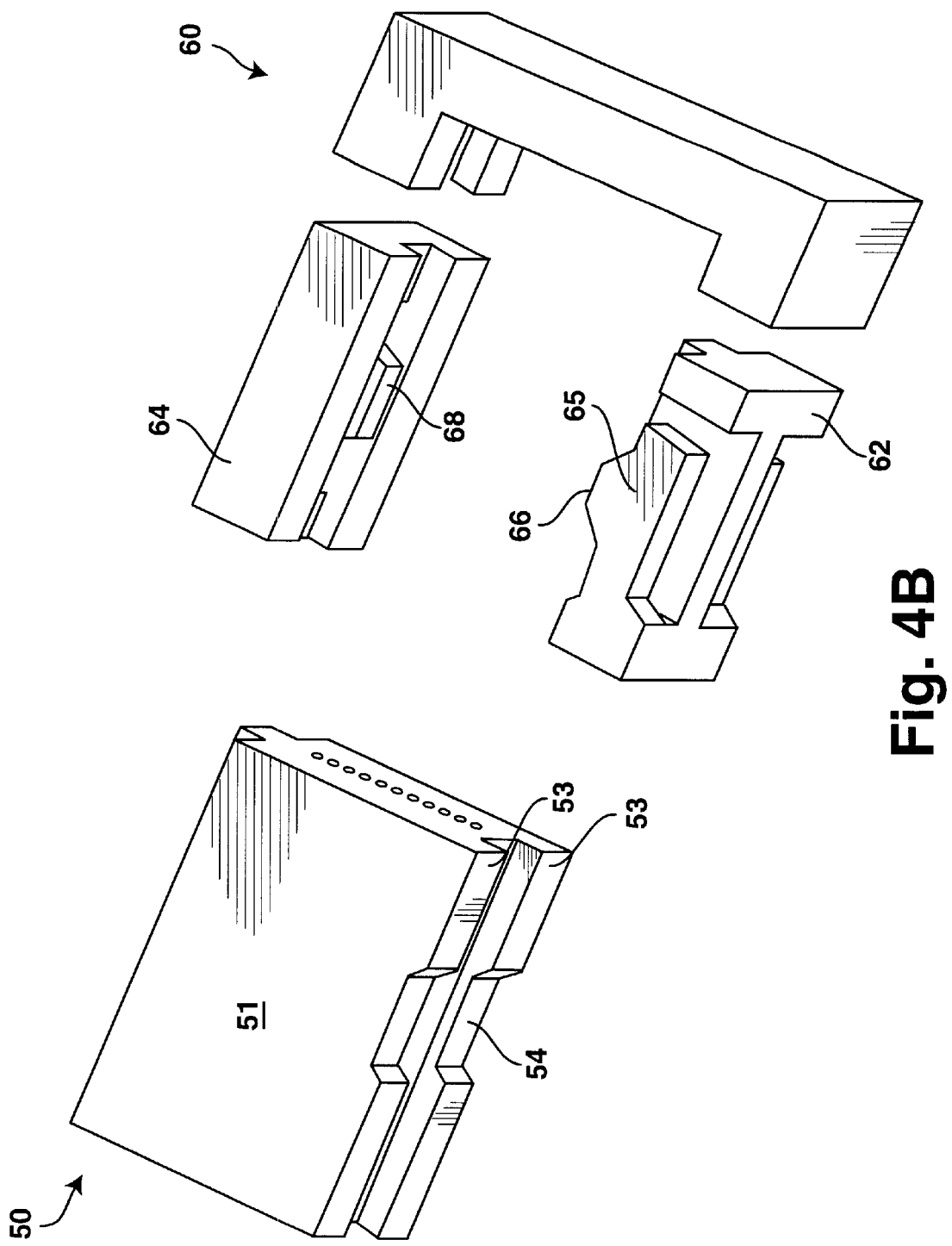
FIG. 4B is a pictorial illustration showing the opposite side view of the card and host socket shown in FIG. 4A.

A third embodiment of the present invention is illustrated in FIGS. 4A and 4B. FIGS. 4A and 4B are pictorial illustrations of opposite sides of a third embodiment of the present invention showing an electronic function card having indentions on its sides and a host socket having corresponding spring-loaded buttons such that when the card is inserted into the host socket the buttons reside within the indentions and a retention force is exerted on the card to securely hold the card within the host socket. As with the second embodiment discussed above, both the host socket 60 and the card casing 50 are each preferably made of a single piece of plastic made from injection molding.

A host socket 60 is shown having two spring-loaded arms 65 in side rail 62 and a spring-loaded arm 67 in side rail 64. On each arm 65 and 67 are buttons 66 and 68, respectively. Each arm 65 and 67 extends from its respective side rail 62 and 64 at one end and is free at the opposite end. In the preferred embodiment, each arm 65 and 67 is also spaced slightly apart from the side rail 62 and 64. The small spacing between the side rails 62 and 64 and the arms 65 and 67 allow each arm 65 and 67 to move in and out when pressed. In this manner, both arms 65 and 67 are spring-loaded and may easily move to the side when the buttons 66 and 68 are pressed against.

An electronic function card 50 is shown that corresponds with the host socket 60. The card casing 51 has an indention (or cavity) 52 on the side arm 55 and two indentions 54 on side arms 53. Once the card 50 is inserted into the host socket 60, the button 66 will reside in the indentions 54 and the button 68 will reside in indention 52. The position of the indentions 54 and 52 are designed to correspond with the buttons 66 and 68 at the midpoint of tolerances with respect to the full insertion of the card 50 into the host socket 60.

As the card 50 is linearly inserted into the host socket 60, the sides arms 53 and 55 of the card 50 slide along the side rails 62 and 64 of the host socket 60. As the buttons 66 and 68 on the host socket 60 encounter the side arms 53 and 55 on the card 50, the arms 65 and 67 are pressed back to allow the card 50 to continue sliding along the side rails 62 and 64. In the preferred embodiment, each button 66 and 68 has angled sides such that when the front edge of the buttons 66 and 68 encounters the side arms 53 and 55, the buttons 66 and 68 will be depressed as the card 50 continues to be inserted into the host socket 60. Then, when the card 50 is fully inserted into the host socket 60, the arms 65 and 67 will move back into their original position and the buttons 66 and 68 reside within indentions 54 and 52.

As with the previous embodiment, the button and indention combination provides both a tactile and auditory feedback to the user that signals when the card has been fully inserted into the host socket and is securely held. Further, the button and indention combination provide an added retention force to ensure that the card is securely inserted into the host socket and that the card won't become dislodged.

Figure 5A:
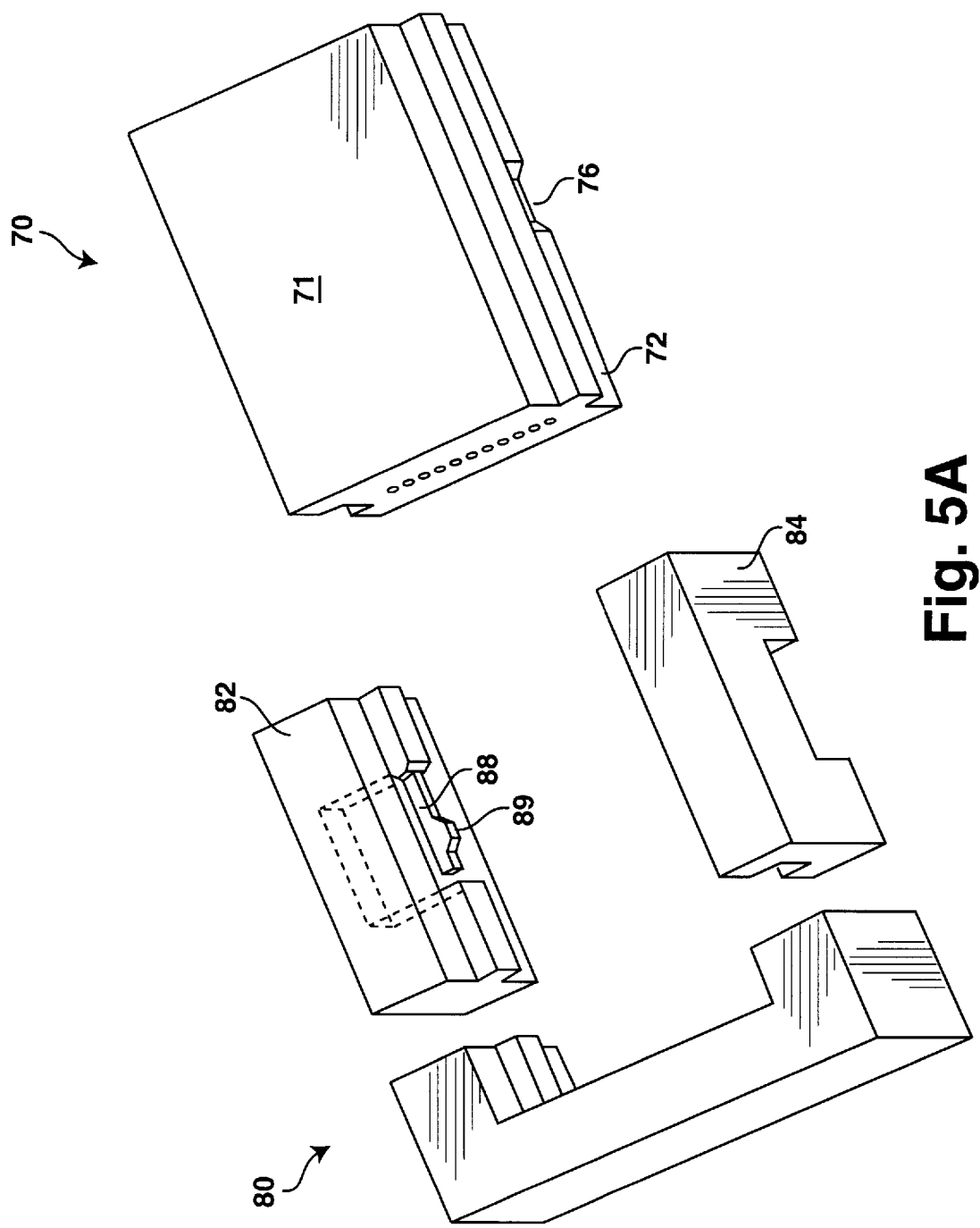
FIG. 5A is a pictorial illustration of a side view of the present invention showing an electronic function card having indentions on its sides that are hidden from the top view and a host socket having corresponding spring loaded buttons such that when the card is inserted into the host socket the buttons reside within the indentions and a retention force is exerted on the card to securely hold the card within the host socket.
Figure 5B:
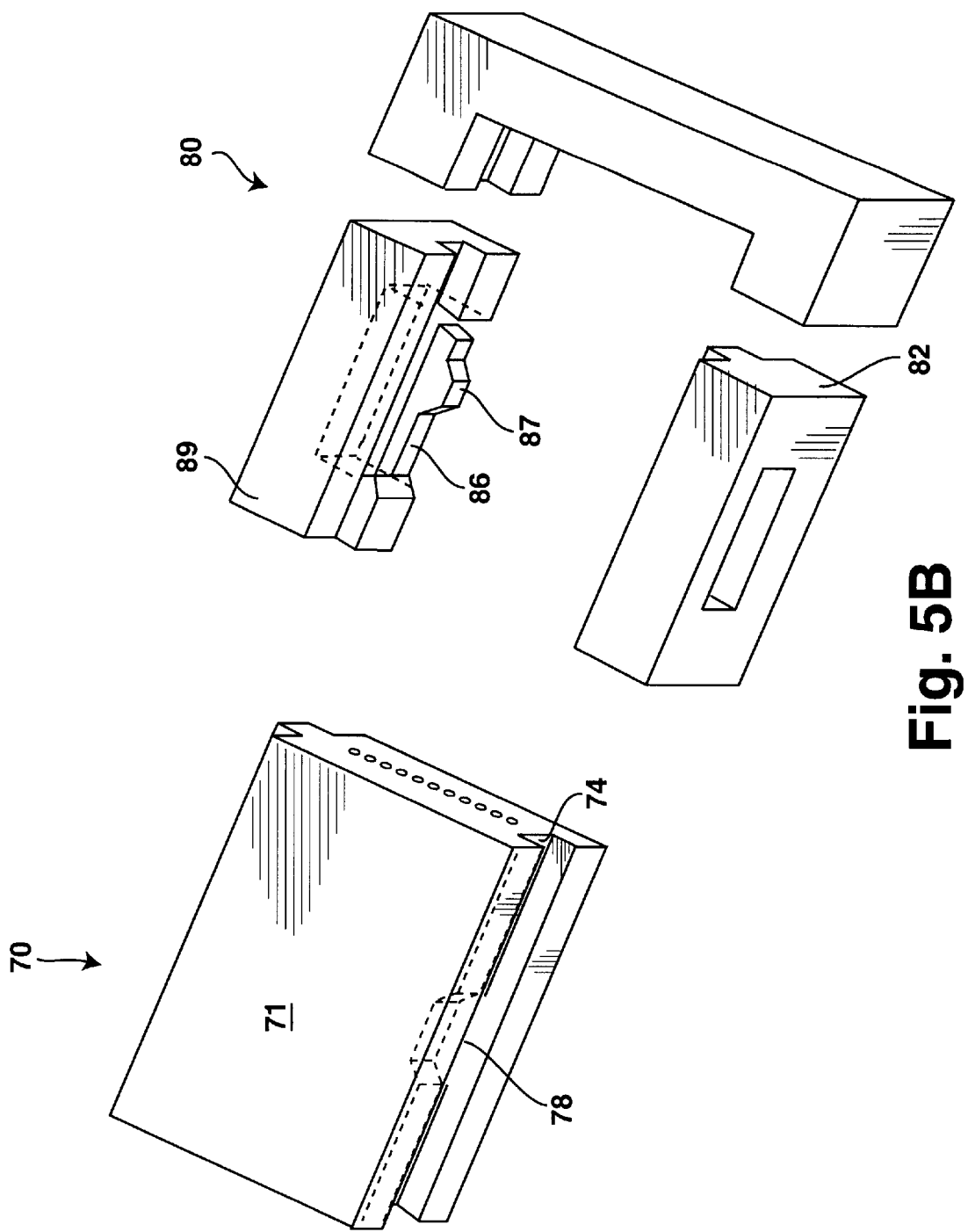
FIG. 5B is a pictorial illustration showing the opposite side view of the card and host socket shown in FIG. 5A.

FIGS. 5A and 5B illustrate a fourth embodiment of the present invention. FIGS. 5A and 5B are pictorial illustrations of opposite side views of the present invention showing an electronic function card having indentions on each side that are hidden from the top view and a host socket having corresponding spring-loaded buttons such that when the card is inserted into the host socket the buttons reside within the indentions and a retention force is exerted on the card to securely hold the card within the host socket. As with the previous embodiments discussed above, both the host socket 80 and the card casing 70 are preferably made of a single piece of plastic made from injection molding.

A host socket 80 is shown having a spring-loaded arm 88 in side rail 82 and a spring-loaded arm 86 in side rail 84. On each arm 88 and 86 are buttons 89 and 87, respectively. Each arm 88 and 86 extends from its respective side rail 82 and 84 at one end and is free at the opposite end. In the preferred embodiment, each arm 88 and 86 is also spaced slightly apart from the side rail 82 and 84. The small spacing between the side rails 82 and 84 and the arms 88 and 86 allow each arm 88 and 86 to move in and out when pressed. In this manner, both arms 88 and 86 are spring-loaded and may move to the side when the buttons 89 and 87 are pressed against.

An electronic function card 70 is shown that corresponds with the host socket 80. The card casing 71 has an indention 76 on the side 72 and an indention 78 on the side 74. Unlike the third embodiment described above, the indentions 78 and 76 on the card 70 are located on the recessed portions of the sides 74 and 72 so that they are hidden from a top view. The button 89 will reside in the indention 78 and the button 87 will reside in indention 76 once the card 70 is inserted into the host socket 80.

As with the previous embodiments, the button and indention combination provides both a tactile and auditory feedback to the user that signals when the card has been fully inserted into the host socket and is securely held. Further, the button and indention combination provide an added retention force on the electronic function card to ensure that the card is fully inserted into the host socket and that the card won't become dislodged.

Figure 6:
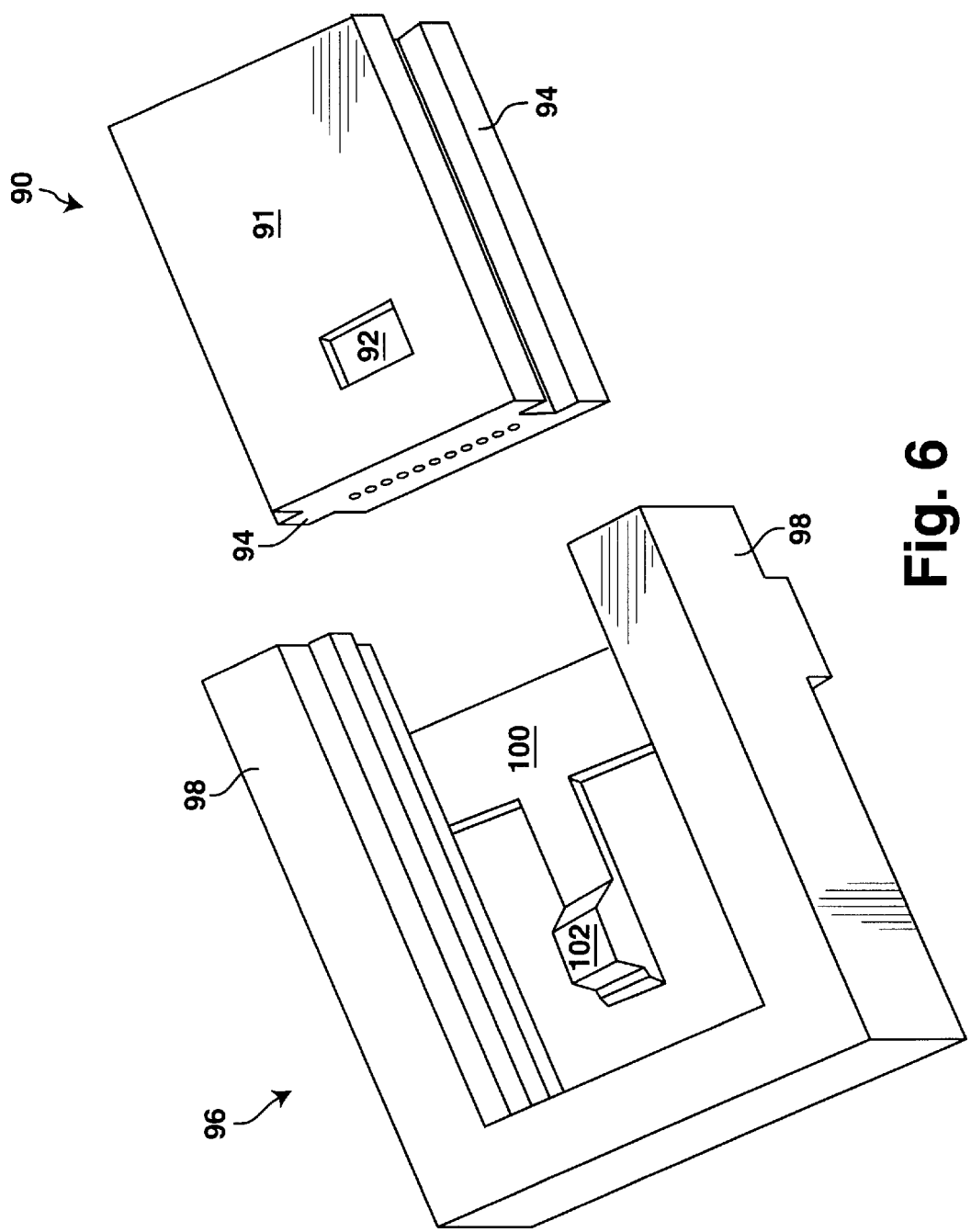
FIG. 6 is a pictorial illustration of a side view of the present invention showing an electronic function card having an indention on its lower surface and a host socket having a corresponding spring loaded button such that when the card is inserted into the host socket the button resides within the indention and a retention force is exerted on the card to securely hold the card within the host socket.

FIG. 6 is a pictorial illustration of a fifth embodiment of the present invention in which an electronic function card has an indention on its lower surface and the host socket has a corresponding spring loaded button, such that when the card is inserted into the host socket the button resides within the indention and a retention force is exerted on the card to securely hold the card within the host socket. As with the previous embodiments discussed above, both the host socket 96 and the card casing 91 are preferably made of a single piece of plastic made from injection molding.

The card 90 is shown upside down in FIG. 6 to show an indention 92 located on the bottom (lower) surface of the card casing 91. The corresponding host socket 96 has a spring-loaded arm 100 extending from the base of the side rails 98 of the host socket 96. The host socket 96 and spring-loaded arm 100 described are preferably a single piece of plastic formed by injection molding. On the end of the spring-loaded arm 100 is a button 102. As the card 90 is linearly inserted into the host socket 96, the card's side arms 94 will slide along the side rails 98 of the host socket 96. The lower front edge of the card 90 will encounter the button 102. Preferably, the button 102 has an angled front edge such that when the front edge of the card 90 encounters the front edge of the button 102, the card 90 will be able to continue to be inserted and the arm 100 will be depressed as the card 90 slides up the button 102. The spring-loaded arm will allow the button 102 to be pressed down out of the way and permit the card 90 to continue sliding along the side rails 98 until the card is fully inserted. Once the card 90 is fully inserted into the host socket 96, the button 102 will return to its original position and reside within indention 92.

As with the previously described embodiments, the button and indention combination provides both a tactile and auditory feedback to the user that signals when the electronic function card has been fully inserted into the host socket and is securely held. Additionally, the button and indention combination provides an added retention force on the electronic function card to ensure that the card is fully inserted into the host socket and that the card won't become dislodged.

Figure 7:
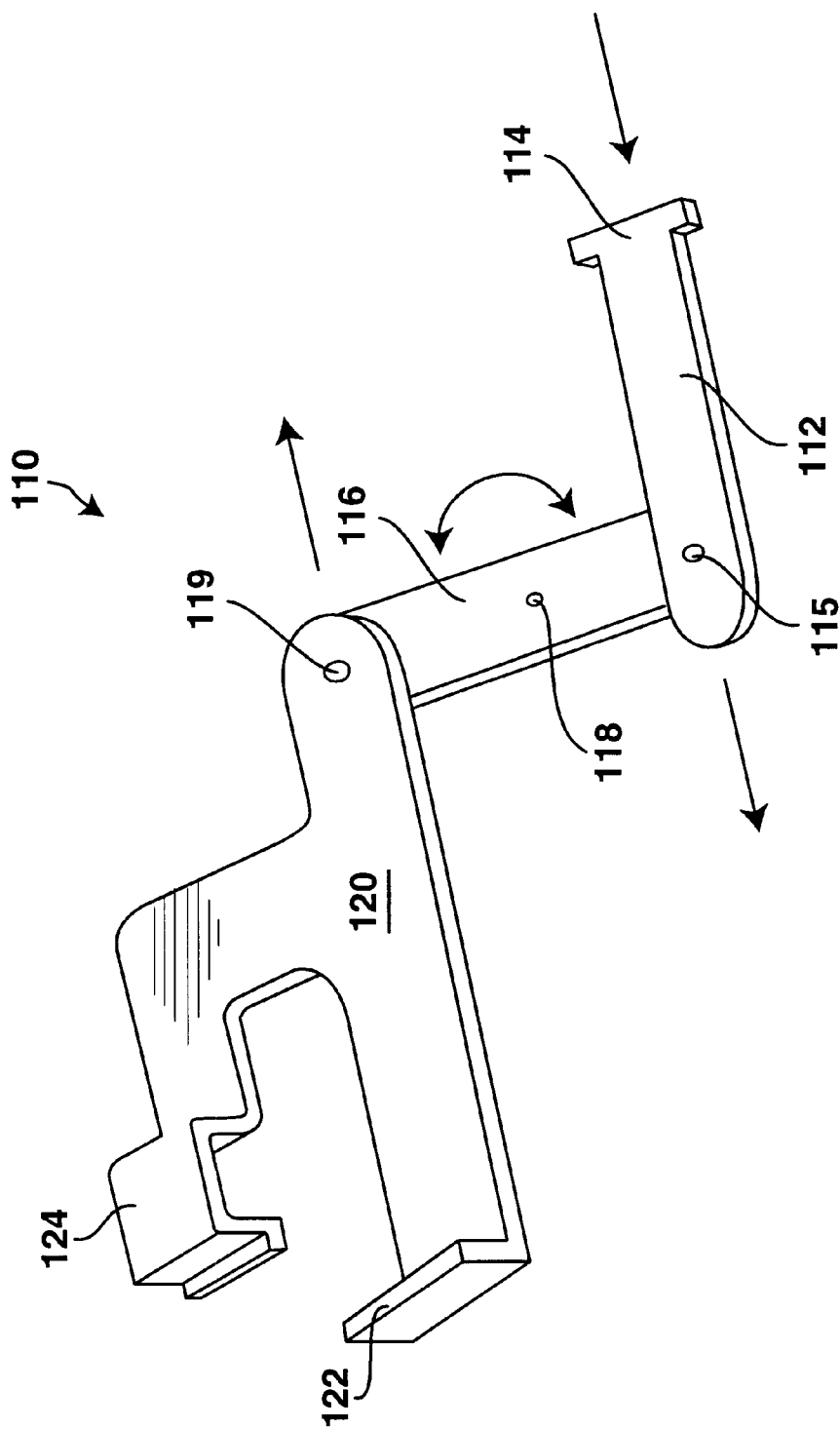
FIG. 7 is a pictorial illustration of a card extractor mechanism for removing a card from a host socket of the present invention.

FIG. 7 is a pictorial illustration of a card extractor mechanism for use with all embodiments of the present invention. The card extractor mechanism 110 removes a card from a host socket of the present invention. When used with the host socket 96 shown in FIG. 6, the card extractor 110 would replace the spring-loaded arm 100 (with the button 124 replacing the button 102) and would be coupled to at least one of the side rails 98 of the host socket 96.

The card extractor mechanism 110 is comprised of an arm 112 rotatably coupled to a connecting piece 116 at point 115. The connecting piece is also rotatably coupled to a support 120 at point 119. Point 118 on the connecting piece 116 is a fixed point. The arm 112, the support 120, and the connecting piece 116 are preferably made from metal such that each piece is able to maintain strength while retaining a small thickness.

When a force is applied to the button 114, the arm 112 moves back along the X-axis as shown by the arrows. The connecting piece 116 then rotates about the fixed point 118 and the support 120 is pulled forward along the X-axis as shown by the arrow. The edge 122 of the support 120 is between the front edge of the electronic function card and the host socket. As the support 120 is pulled forward, the edge 122 exerts a force against the front edge of the card which pulls the card from the host socket. As the card is pulled from the host socket, the spring-loaded button 124 will be pressed down to allow the card to slide out of the host socket.

Figure 8A:
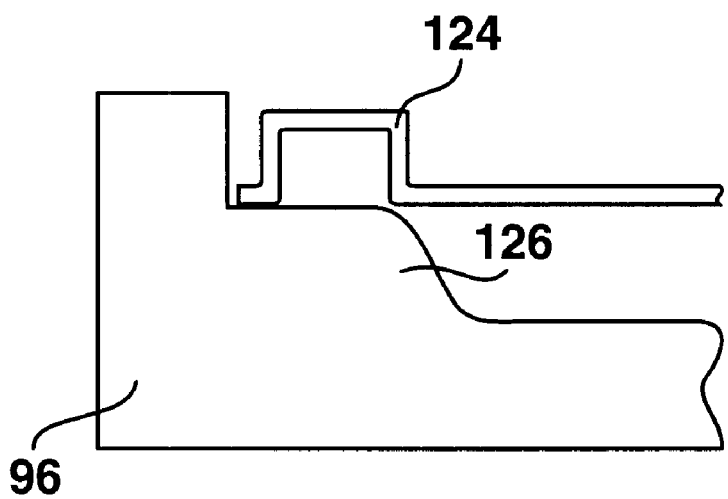
FIG. 8A is a side view of the extractor mechanism button and host socket in the closed position.
Figure 8B:
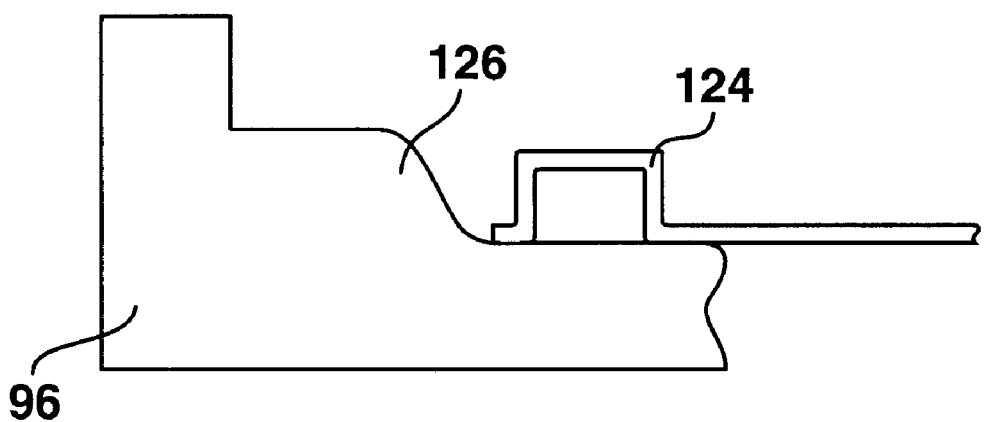
FIG. 8B is a side view of the extractor mechanism button and host socket in the open position.

FIGS. 8A and 8B show a partial side-view of the host socket 96 (see FIG. 6) and the button 124 of the extractor mechanism 110 (see FIG. 7). A cam 126 on the host socket 96 pushes the button 124 into the indention 92 of the card 90 when the extractor 110 is in the closed position. When the extractor is pushed to the open position (when a force is applied to the button 114), the button 124 is moved away from the cam 126. This allows the button 124 to fall away from the card 90 and release the button 124 from the indention 92. In this manner, the card extractor 110 is used to overcome the retention forces exerted on a card, the button is released from the indention, and the card is easily removed from the host socket. The card extractor mechanism 110 may be modified and added to each of the above described embodiments to provide an easy way of releasing the added retention force exerted on the card by the button and indention combinations.

Each of the above described embodiments of the present invention provide a low cost feature over the prior art that increases the retention forces on an electronic function card and reduces the chance of the card becoming dislodged from its host socket during mechanical shock events. Additionally, the present invention provides both a tactile and auditory feedback to the user to indicate when the card is fully inserted and secure within the host socket. Although several embodiments of the present invention have been described, other designs using the present invention are possible. Note that the button and/or indention may be located on any side of the card casing, including the top surface, bottom surface, and all surfaces of the side arms of the casing, with a corresponding indention and/or button located on the host socket.

I claim:

1. An apparatus for retaining an electronic function card in communication with a data processing device, comprising:
   a receptacle for receiving said electronic function card;
   a spring-loaded arm extending from said receptacle with at least one button located on said arm, said button having an obtusely angled front edge, arranged such that when said card is fully inserted into said receptacle, said button resides within a corresponding indention on said card.

2. The apparatus of claim 1, further comprising at least one side rail extending from said receptacle and at least one side arm extending from said card, wherein said side rail and said side arm are slidably engaged when said card is inserted into said receptacle.

3. The apparatus of claim 1, wherein said button exerts a retention force on said indention when the electronic function card is fully inserted into the receptacle.

4. An apparatus for retaining an electronic function card in communication with a data processing device, comprising:
   a receptacle for receiving said electronic function card inserted linearly into said
   receptacle; and
   a spring loaded arm having at least one stop on said arm, said stop having an obtusely angled front edge, said arm extending from said receptacle such that said arm may be deflected to allow said card to clear said stop while being inserted into said receptacle, said arm returning to a position, once said card is fully inserted, such that said stop is arranged in proximity to said card so as to prevent said card from becoming dislodged from said receptacle.

5. The apparatus of claim 4, wherein said arm returns to a position, once said card is fully inserted, such that said stop exerts a retention force on said card.

6. A method of retaining an electronic function card in communication with a data processing device, comprising:
   providing a receptacle for receiving said card, said receptacle having at least one spring-loaded button;
   providing an electronic function card comprising an integrated circuit housed within a casing, said casing having at least one indention, said indention having an obtusely angled front edge; and
   inserting said card into said receptacle such that said at least one button resides within said at least one indention.

7. The method of claim 6, wherein said receptacle has at least one side rail and said card has at least one side arm, and said side rail and said side arm are slidably engaged after inserting said card into said receptacle.

8. The method of claim 6, wherein said at least one button resides within said at least one indention and exerts a retention force on said indention.

9. A method of retaining an electronic function card in communication with a data processing device, comprising:
   providing said electronic function card, the card comprising an integrated circuit housed within a casing; and
   providing a receptacle for receiving said card, said receptacle having at least one spring-loaded arm extending from said receptacle, said spring-loaded arm having at least one stop, said stop having an obtusely angled front edge; and
   linearly inserting said card into said receptacle such that said at least one stop exerts a retention force on said card.

10. A method of retaining an electronic function card in communication with a data processing device, comprising:
    providing said electronic function card, the card comprising an integrated circuit housed within a casing;
    providing a receptacle for receiving the card, the receptacle having at least one spring-loaded arm, the arm having at least one stop, the stop having an obtusely angled front edge;
    deflecting the arm to allow the card to clear the stop;
    inserting the card linearly into the receptacle;
    returning the arm to a position such that the stop is arranged in proximity to the card so as to prevent the card from becoming dislodged from the receptacle.

11. The method of claim 10 wherein the arm is returned to a position such that the stop exerts a retention force on the card.

* * * * *